(12) United States Patent
Yamane et al.

(10) Patent No.: US 6,693,370 B2
(45) Date of Patent: Feb. 17, 2004

(54) ELECTRIC JUNCTION BOX FOR VEHICLE

(75) Inventors: Shigeki Yamane, Nagoya (JP); Takahiro Onizuka, Nagoya (JP); Isao Isshiki, Nagoya (JP)

(73) Assignees: Autonetworks Technologies, Ltd., Nagoya (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/277,029

(22) Filed: Oct. 22, 2002

(65) Prior Publication Data

US 2003/0045137 A1 Mar. 6, 2003

Related U.S. Application Data

(62) Division of application No. 09/814,796, filed on Mar. 23, 2001, now Pat. No. 6,494,723.

(30) Foreign Application Priority Data

Mar. 31, 2000 (JP) ........................................ 2000-097663
May 12, 2000 (JP) ........................................ 2000-139825

(51) Int. Cl.[7] ................................................ H05K 7/18
(52) U.S. Cl. ..................... 307/10.1; 307/147; 174/68.2; 361/637
(58) Field of Search ................................. 307/10.1, 147; 361/637, 639; 174/68.2

(56) References Cited

U.S. PATENT DOCUMENTS

| | | | |
|---|---|---|---|
| 4,034,271 A | * | 7/1977 | Palazzetti et al. ............ 361/601 |
| 5,729,436 A | | 3/1998 | Yoshigi et al. |
| 5,742,005 A | | 4/1998 | Saka et al. |
| 5,778,528 A | | 7/1998 | Saka et al. |
| 5,797,763 A | | 8/1998 | Saka et al. |
| 5,928,004 A | | 7/1999 | Sumida et al. |
| 5,934,929 A | | 8/1999 | Saka et al. |
| 6,000,952 A | | 12/1999 | Gladd et al. |
| 6,011,319 A | | 1/2000 | Kelly et al. |
| 6,126,457 A | | 10/2000 | Smith et al. |
| 6,295,201 B1 | * | 9/2001 | Ogden et al. ................ 361/704 |
| 6,466,451 B2 | * | 10/2002 | Mizuno et al. .............. 174/260 |
| 6,494,723 B2 | * | 12/2002 | Yamane et al. ............. 439/76.2 |
| 6,503,090 B2 | * | 1/2003 | Onizuka ....................... 439/75 |
| 6,538,878 B1 | * | 3/2003 | Acker et al. ................ 361/624 |
| 6,573,616 B2 | * | 6/2003 | Yamane ...................... 307/10.1 |
| 6,583,353 B2 | * | 6/2003 | Murakoshi et al. ........... 174/50 |

FOREIGN PATENT DOCUMENTS

| | | |
|---|---|---|
| JP | 6-295752 A | 10/1994 |
| JP | 8-79942 A | 3/1996 |
| JP | 9-182251 A | 7/1997 |

* cited by examiner

*Primary Examiner*—Brian Sircus
*Assistant Examiner*—Roberto J. Rios
(74) *Attorney, Agent, or Firm*—Oliff & Berridge, PLC

(57) ABSTRACT

Instead of a relay block which is present in bus bar circuits in a conventional electric junction box, semiconductor switching devices 14 are provided, and a power distributing unit PD which is independent of a bus bar circuit unit JB is structured by concentrating these semiconductor switching devices 14, output terminals 12 of this power distributing unit PD being connected to appropriate bus bars 32 of the bus bar circuit unit JB. The power distributing unit PD and the bus bar circuit unit JB are incorporated in a common housing 40.

19 Claims, 12 Drawing Sheets

ELECTRIC JUNCTION BOX FOR VEHICLE

This is a Division of application Ser. No. 09/814,796 filed Mar. 23, 2001, now U.S. Pat. No. 6,494,723. The entire disclosure of the prior application(s) is hereby incorporated by reference herein in its entirety.

BACKGROUND OF THE INVENTION

1. Field of the Invention

The present invention relates to an electric junction box and terminals used in the electric junction box. The electric junction box is used for a vehicle for electrically connecting a plurality of vehicle-mounted loads to a power source such as a battery mounted therein.

2. Description of the Related Art

Conventionally, as an electric junction box provided in a vehicle, one is generally known which is provided with a bus bar board in which each group of metallic bus bars and each of insulating plates are alternately laminated, and a vehicle-mounted power source (e.g., a battery) is connected to a multiplicity of vehicle-mounted loads (electrical apparatuses) through bus bar circuits formed by the bus bar board. Further, a mechanical relay block is incorporated in the bus bar board such that current between the vehicle-mounted power source and the loads can be subjected to on/off switching midway thereof, as required.

FIG. 13 illustrates an example of a structure for incorporating the mechanical relay into an electric junction box. In FIG. 13, a bus bar board 102 is accommodated within an insulated housing 101, and end portions of bus bars making up the bus bar board 102 are bent upward to form a plurality of tab terminals 103, relay terminals 105 being adapted to be fitted to the tab terminals 103. Meanwhile, a connector housing portion 104 for relay is integrally formed on the insulated housing 101 to project outward from its outer surface. A plurality of terminal accommodating chambers 104a, into which the tab terminals 103 and the relay terminals 105 are inserted from the reverse side (lower side in the drawing), are formed in the housing portion 104. Further, as terminals of a relay block 106 are inserted in the terminal accommodating chambers 104a, the terminals of the relay block 106 are connected to the tab terminals 103 through the relay terminals 105, and the relay block 106 is fitted to the outer surface of the insulated housing 101.

With the above-described conventional electric junction box, it is necessary to build the relay block 106 on the bus bar board 102, but since the relay block 106 is of a mechanical type and of large-current specifications in which the relay block 106 is directly connected to the vehicle-mounted battery, its structure is inevitably large in size.

Meanwhile, on the bus bar board 102 side, a space for presenting the relay block 106 is required in its appropriate portion, so that the area of the bus bar board 102 increases by that margin, and the structure becomes complex. Moreover, since it is necessary to raise the plurality of (three in the illustrated example) tab terminals 103 at mutually proximate positions from the bus bar board 102 in order to connect the relay block 106 to the board, it is necessary to design the layout having leeway so that the bus bars do not interfere with each other. In some cases, there arises a need to increase the number of laminations of the bus bars.

For the above-described reasons, with the conventional electric junction box, its compact size and simplification of its structure are considered difficult, and drastic measures for them have been important tasks.

Furthermore, with the above-described conventional structure, in a case where a change of the working current, i.e., a change of the relay capacity, is made in accordance with the grade and the like of the vehicle, the size of the relay block 106 also changes in correspondence with the change. For this reason, the intervals between the plurality of tab terminals 103 and their positions of formation for connection of the relay block 106 must be changed. Namely, with the above-described conventional structure, since the relay block 106 is interposed in the circuitry formed by the bus bar board 102, in the case where the relay block 106 having a different size is used in correspondence with a change of specifications and the like, a design change of the overall bus bar board 102 must be made in correspondence with the relay block 106, so that there is a drawback in that versatility is low.

By the way, another example of the electric junction box is also disclosed in JP-A-9-182251, in which circuits whose current values differ from each other are integrated on the same board.

In its configuration, circuits whose current values differ are formed in a pair of housings, and bus bars for large currents, covered wires for medium currents, and printed circuits for small currents are selectively used in correspondence with the current values of the circuits.

In the above-described configuration, since necessary and sufficient wiring materials can be adopted in correspondence with the current values, it is possible to form a very compact electric junction box.

In recent years, however, a configuration has come to be required in which the covered wires and the printed circuits are satisfactorily connected as the structure of electrical wiring. However, if the wiring materials are merely selected in correspondence with the current values, it has been difficult to satisfactorily connect the covered wires and the printed circuits.

SUMMARY OF THE INVENTION

In view of the above-described circumstances, an object of the invention is to provide an electric junction box which makes it possible to establish electrical connection between a power source and loads with a compact and simple structure and which excels in versatility.

Another object of the invention is to provide terminals which, in particular, make it possible to satisfactorily connect covered wires and printed circuits in adopting necessary and sufficient wiring materials in correspondence with current values, and an electric junction box using the same.

According to a first aspect of the invention, there is provided an electric junction box for a vehicle for connecting a plurality of vehicle-mounted loads to a power source mounted in a vehicle, comprising: a power distributing unit which has an input terminal connected to the power source and a plurality of output terminals and in which semiconductor switching devices are interposed between the output terminals and the input terminal; and a bus bar circuit unit which has metallic bus bars for forming circuits and insulating plates each laminated thereon and connects the output terminals of the power distributing unit to the plurality vehicle-mounted loads, wherein the power distributing unit and the bus bar circuit unit are incorporated in a common housing in a state in which some of the bus bars of the bus bar circuit unit and the output terminals of the power distributing unit are connected.

In accordance with the above-described construction, since the semiconductor switching devices of the power distributing unit connected to the bus bar circuit unit function as a relay block in the conventional electric junction box, not only can the relay block be omitted, but a terminal structure for attaching the relay block to the bus bar board can be omitted from the bus bar circuit unit, so that the construction of the bus bar circuit unit can be remarkably simplified. Moreover, the power distributing unit is arranged such that small semiconductor switching devices are interposed between the input terminal and the output terminals, so that the power distributing unit is provided with a compact and lightweight arrangement as compared with the mechanical relay block. Accordingly, the electric junction box in accordance with the invention is able to establish electrical contact between the power source and the loads with a compact and simple structure as compared with the conventional electric junction box.

In addition, with this electrical junction box, since the power distributing unit and the bus bar circuit unit are independent of each other, the following advantages are offered as compared with the conventional construction in which a relay block is present in the bus bar circuit unit.

(1) In a case where, for example, the semiconductor switching devices must be replaced in conjunction with a change of the working current or the like, a common bus bar circuit unit can be used if there is no change on the bus bar circuit unit side. Namely, depending on the contents of the change of specifications, a measure can be provided by the replacement of the power distributing unit alone without making a design change of the bus bar circuit unit.

(2) The semiconductor switching devices used in the power distributing unit are of a type in which the amount of heat generated is generally relatively high, and there are many cases in which radiation and cooling are required for it. Here, with the structure in which the relay block 106 is interposed in the bus bar circuit unit in the conventional manner, even if the relay block 106 is simply substituted by the semiconductor switching devices, it is extremely difficult to efficiently radiate to outside the housing the heat generated by the semiconductor switching devices which are disposed in a distributed manner in the bus bar circuit unit, and this has been a major obstacle to the introduction of the semiconductor switching devices. With the structure in accordance with the invention, however, since the semiconductor switching devices to be connected to the bus bar circuit unit are disposed in a concentrated manner in the power distributing unit which is independent of the bus bar circuit unit, the cooling processing of the semiconductor switching devices can be effected collectively in the power distributing unit.

Specifically, the arrangement provided is such that a radiating member connected to the semiconductor switching devices in such a manner as to be capable of transferring heat is disposed in the power distributing unit, and the power distributing unit is built is the housing such that the radiating member is exposed from the outer surface of the housing. Accordingly, the radiation and cooling of the semiconductor switching devices can be efficiently effected collectively.

For example, an arrangement can be provided such that the power distributing unit is provided with a drain connection plate on which the semiconductor switching devices are mounted in a state in which the drain connection plate is electrically connected to the input terminal of the power distributing unit and input-side energizing terminals of the semiconductor switching devices are electrically connected to the drain connection plate, and the radiating member is connected to the drain connection plate in such a manner as to be capable of transferring heat. If such an arrangement is provided, the input-side energizing terminals of the semiconductor switching devices can be electrically connected collectively to the common input terminals by using the drain connection plate, and the radiating member exposed on the outer surface of the housing can be thermally connected collectively. Accordingly, simplification of the circuit configuration and highly efficient cooling can be realized with a simple structure.

Here, as for the drain connection plate, it suffices if the drain connection plate can be electrically connected to the input terminal, and the two members may be formed of separate members and may be mechanically and electrically connected by welding, for instance. However, if the input terminal and the drain connecting terminal are formed of one and the same metal plate, the structure of the electric junction box for a vehicle can be made further compact and thin by further reducing the number of component parts.

In the invention, the specific structure for connecting the output terminals of the power distributing unit and the bus bar circuit unit can be variously set. For example, in a case where the bus bar circuit unit is formed by alternately superposing each of groups of the bus bars and each of the insulating plates in a plurality of layers, the bus bars in a lowermost surface of the bus bar circuit unit are exposed. Accordingly, as the output terminals of the power distributing unit are connected to some of the bus bar circuits, linkage can be established between the power distributing unit and the bus bar circuit unit with a simple structure.

The output terminals of the power distributing unit and some of the bus bars may be connected by, for instance, wire bonding, but if the structure provided is such that they are connected in a state of being directly superposed, more reliable connection can be obtained. In addition, simple means such as welding can be adopted, thereby making it possible to ensure sufficient mechanical strength of the connected portions.

In addition, an arrangement may be provided such that the output terminals of the power distributing unit are arrayed in one direction in a state of projecting in a same direction, while a plurality of power-distributing-unit connecting bus bars are arrayed in a peripheral edge portion of the bus bar circuit unit in a direction parallel to the direction of array of the output terminals, such that the power distributing unit and the bus bar circuit unit are disposed at mutually adjacent positions in a state in which the bus bars and the output terminals are connected to each other. If this arrangement is adopted, the output terminals of the power distributing unit and the bus bars of the bus bar circuit unit can be connected by shortest routs, and the power distributing unit and the bus bar circuit unit can be accommodated in the housing in a compact form.

Further, if an arrangement is provided such that the semiconductor switching devices are arrayed in a direction parallel to the direction of array of the output terminals in the power distributing unit, and output-side energizing terminals of the semiconductor switching devices are directly connected to the output terminals, the power distributing unit itself can be also made compact.

Furthermore, an arrangement may be provided such that not only the output terminals but the output terminals and the input terminal of the power distributing unit are arrayed in one direction in a state of projecting in the same direction, while the plurality of power-distributing-unit connecting bus bars are arrayed in the peripheral edge portion of the bus bar circuit unit in the direction parallel to the direction of array of the output terminals and the input terminal, and as the bus bars are connected to the output terminals and the input terminal, the input terminal is connected to the power source through the bus bar circuit unit. If this arrangement is adopted, all the input and output between the power distributing unit and the external circuits can be collectively effected through the bus bar circuit unit. Hence, the circuitry can be rationalized, and the power distributing unit itself can be made further compact.

With this electric junction box, a circuit for controlling the current ON/OFF of the semiconductor switching devices is required, but the place where this circuit is disposed can be set variously, and may be disposed in the power distributing unit or may be disposed at other places. For example, in a case where a control circuit board which is connected to external vehicle-mounted electronic units through the bus bar circuit unit is incorporated in the housing, if an switching control circuit which is electrically connected to switching controlling terminals of the semiconductor switching devices of the power distributing unit to control the switching of the semiconductor switching devices is incorporated in the control circuit board, it is possible to control the switching of the semiconductor switching devices with a simple structure without especially adding a circuit board for switching control.

Furthermore, the switching control circuit of the control circuit board and the switching control terminals of the semiconductor switching devices provided in the power distributing unit may be electrically connected through the bus bar circuit unit. By the effective use of such a bus bar circuit unit, the structure for connection between the switching control circuit and the power distributing unit can be simplified.

Specifically, an arrangement may be provided such that controlling terminals which are connected to the switching control terminals of the semiconductor switching devices are provided in the power distributing unit, and the controlling terminals and the output terminals are arrayed in one direction in a state in which each of the controlling terminals and each of the output terminals are alternately arranged and project in a same direction, while a plurality of power-distributing-unit connecting bus bars are arrayed in a peripheral edge portion of the bus bar circuit unit in a direction parallel to the direction of array of the output terminals and the controlling terminals, such that the power distributing unit and the bus bar circuit unit are disposed at mutually adjacent positions in a state in which the bus bars are connected to the output terminals and the controlling terminals. By adopting such an arrangement, it is possible to accurately effect connection between the switching control terminals and the output-side energizing terminals of the semiconductor switching devices on the one hand, and the bus bar circuit unit on the other hand, while making the overall electric junction box compact by the adjacent arrangement.

In addition, if the control circuit board is disposed in a state of being substantially parallel to a direction of array of the power distributing unit and the bus bar circuit unit, the electric junction box can be made further compact.

In this case, an arrangement may be made such that the control circuit board is disposed such that at least a portion of the control circuit board overlaps the power distributing unit (i.e., the control circuit board is disposed close to the power distributing unit), and a board accommodating portion for accommodating the control circuit board and a connector portion for connecting the bus bar circuit unit to external circuits are formed in a juxtaposed manner in the housing. If this arrangement is adopted, the space for accommodating the control circuit board and the space for disposing the connector portion can be arranged rationally, thereby making it possible to make the electric junction box further compact.

In addition, an arrangement may be provided such that the semiconductor switching devices are arrayed in a direction parallel to the direction of array of the output terminals and the controlling terminals, and output-side energizing terminals and the switching control terminals of the semiconductor switching devices are respectively directly connected to the output terminals and the controlling terminals. If this arrangement is adopted, the power distributing unit itself can be made compact.

In the invention, although the specific layout of the terminals in the power distributing unit is not particularly restricted, if the terminals are formed of a metal plate and are arranged in a substantially identical plane, the thickness of the power distributing unit can be made very small, which in turn can contribute to the compact and thin size of the entire electric junction box.

It should be noted that the phase that the "terminals are arranged in a substantially identical plane" is not necessarily to be construed as limiting the terminals to those in which the entire portions of all the terminals are arranged in the identical plane, i.e., all the terminals are planar, but is to be construed to include those in which the input terminal or the output terminals have a shape in which they partially deviate from the "identical plane." For example, the terminals may be of such a shape that tabs for connection are formed by bending a portion or portions of the input terminal or output terminals which are basically arranged in the identical plane, or end portions of the terminals project in a plurality of rows.

Furthermore, the terminals may be integrally formed by resin molding, and if a power distributing unit housing is formed by this resin molding, the arrangement of the terminals can be reliably fixed with a structure having a small number of component parts.

Moreover, according to a second aspect of the invention, there is provided a terminal mounted on an electric wiring board having a wire circuit formed by a covered wire and a printed circuit formed by a printed conductor, characterized by comprising: a connecting portion capable of electrically connecting an internal circuit of said electric wiring board to an external circuit; a lead portion capable of being electrically connected to said printed circuit of said electric wiring board; and a press-fitting portion capable of being electrically connected to said wire circuit of said electric wiring board, wherein said connecting portion, said lead portion, and said press-fitting portion are formed integrally.

Moreover, according to a third aspect of the invention, there is provided an electric junction box including a housing mounted in a vehicle, an electric wiring board accommodated in said housing and having internal circuits, and connection ports for connecting external circuits to said internal circuits of said electric wiring board, in which each of said internal circuits has a wire circuit formed by a covered wire and a printed circuit formed by a printed conductor, characterized in that said lead portion and said press-fitting portion of each of said terminals according to claim 1 are selectively connected to said printed circuit and said wire circuit, respectively, to allow said connecting portion of said terminal to be connected to said external circuit.

In the invention, the connecting portion which is connected to an external circuit (electronic component) is provided integrally with the lead portion and the press-fitting portion, and electrically conducts with respect to the lead portion and the press-fitting portion. Therefore, the external circuits (connectors, fuses, and the like) can be selectively connected to the printed circuits electrically connected to the lead portions and the covered wires which are electrically connected to the press-fitting portions. Consequently, the covered wire can be connected to the printed circuit located immediately therebelow, thereby making it possible to obtain a more versatile wiring form.

The connecting portion in terms of its form may form a male terminal in the same way as a bus bar tab, or may form a female terminal such as a fuse terminal.

The press-fitting portion in terms of its form is formed in a U-shape, such that the covered wire is pressed into its opening to press open a covering portion of that covered wire so as to connect the internal core to edges at the opening. The opening may be upwardly oriented or downwardly oriented.

The phrase "external circuit" referred to in the invention is a concept which includes a flat fuse, a relay, and the like and includes a terminal provided in a connector of a wire harness connected to the electric junction box. Further, the phrase "selectively connected" means a form in which a printed circuit and a covered wire, an external circuit and a printed circuit, or an external circuit and a covered wire are connected.

In a preferred form, said electric wiring board includes a printed circuit board for forming said printed circuits and a wire circuit board mounted on said printed circuit board to form said wire circuits, and said terminals are fixed to said wire circuit board.

If this arrangement is provided, the terminals can be arranged in order on, for instance, the upper surface of the wire circuit board, so that there is an advantage in that the alignment of the terminals can be effected easily.

In another preferred form, said terminal connects said covered wire of said wire circuit board and said printed circuit formed on said printed circuit board.

If this arrangement is adopted, the printed circuit formed immediately below the covered wire can be connected to the covered wire, thereby making it possible to obtain a shorter wiring form.

The electric junction box in accordance with still another preferred form further comprises: a load supporting member whereby a connecting load acting on said terminal from a connector of the external circuit at the time of insertion of the connector is supported by said housing.

If this arrangement is adopted, an external force can be received by the housing through the wire circuit board, an excess stress is prevented from being exerted on the printed circuit board with the wire circuit board mounted thereon, making it possible to suppress solder cracks.

BRIEF DESCRIPTION OF THE DRAWINGS

FIGS. 9A and 9B are enlarged perspective views of a terminal attaching portion shown in FIG. 8, in which FIG. 9A is an exploded view, and FIG. 9B is an assembly drawing.

DETAILED DESCRIPTION OF THE PRESENT INVENTION

Figure 1:
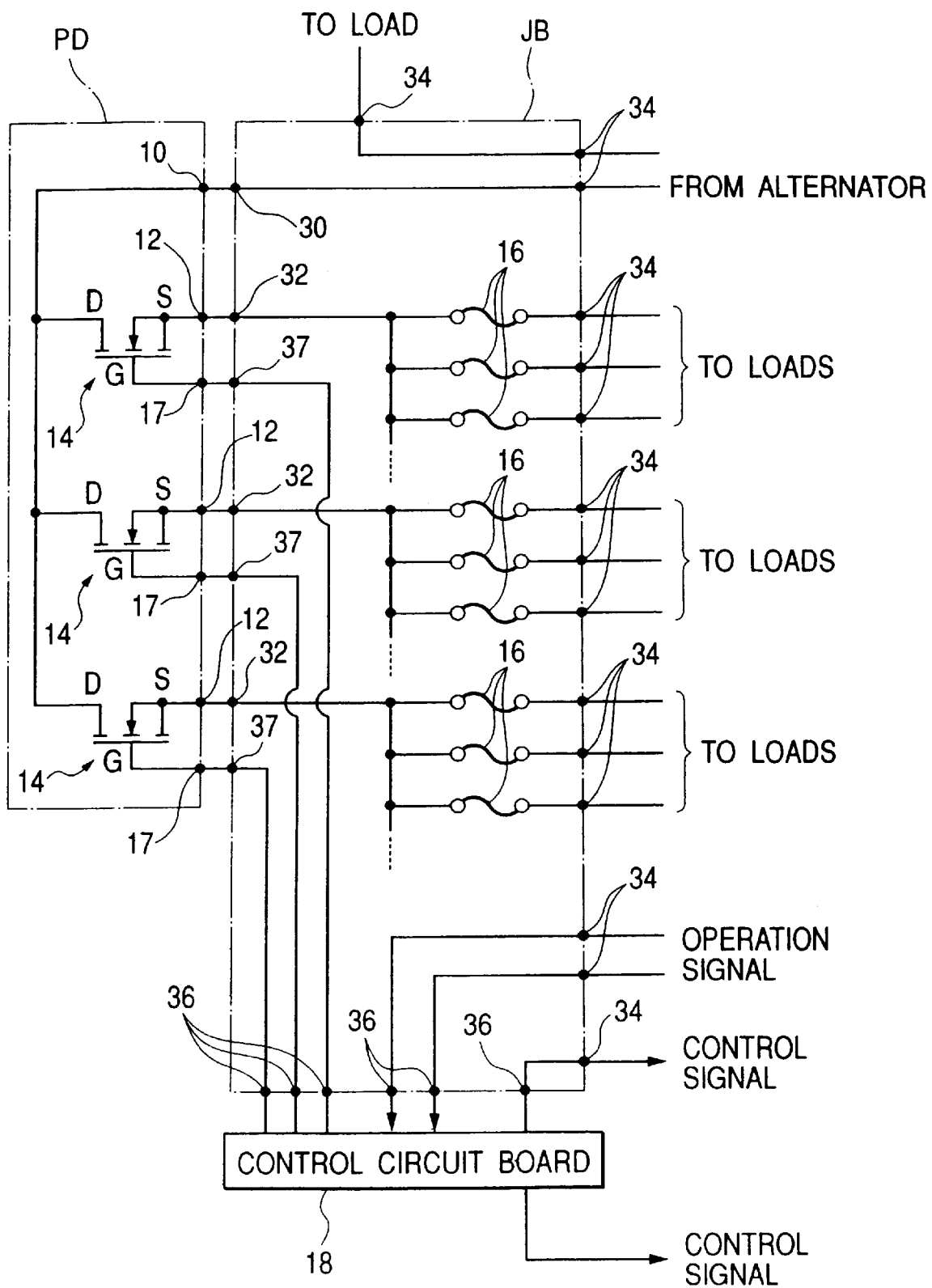
FIG. 1 is a circuit diagram of an electric junction box for a vehicle in accordance with a first embodiment of the invention.

The present invention will be described in detail with reference to the accompanying drawings.

First Embodiment

First, referring to FIG. 1, a description will be given of a circuit configuration of an electric junction box for a vehicle in accordance with a first embodiment.

The circuitry concerning this electric junction box is comprised of a power distributing unit PD connected to a vehicle-mounted power source (a battery in the drawing), a bus bar circuit unit JB configured by a bus bar board, and a control circuit board 18.

The power distributing unit PD has an input terminal 10 which is connected to the battery, a plurality of (three in the illustrated example) output terminals 12, controlling terminals 17 in the same number, and semiconductor switching devices (MOSFETs 14 in the illustrated example, hereafter simply referred to as "FETs") are respectively interposed between the input terminal 10 and the respective output terminals 12. Specifically, an input-side energizing terminal (drain) of each FET 14 is connected to the common input terminal 10, an output-side energizing terminal (source) of each FET 14 is connected to the output terminal 12 corresponding thereto, and a switching controlling terminal (gate) of each FET 14 is connected to the controlling terminal 17 corresponding thereto.

It should be noted that the number of the output terminals 12 may be set appropriately in correspondence with locations and kinds of objects to be distributed to in the vehicle. In the illustrated example, the objects to be distributed to are classified into three groups including an IG-related load (wipers, a window washer, a heater, etc.), an Acc-related load (a cigar lighter, audio equipment, and accessories), and a +B-related load (tail lamps, a panel lamp, etc.), and the FET 14 and the output terminal 12 are provided for each group.

The bus bar circuit unit JB is configured by a bus bar board in which each of bus bar layers formed of metal plates and each of insulating layers formed of insulating plates are alternately laminated in a multiplicity of layers. Provided at a peripheral edge portion of the board are an input-terminal connecting bus bar (power-distributing-unit connecting bus bar) 30 connected to the input terminal 10 of the power distributing unit PD, output-terminal connecting bus bars (power-distribution-unit connecting bus bars) 32 respectively connected to the output terminals 12, and controlling-terminal connecting bus bars 37 respectively connected to the controlling terminals 17. Further, outwardly projecting external connection tabs 34 and control-circuit-board connection tabs 36 are formed at appropriate positions of the bus bars, and the control-circuit-board connection tabs 36 are adapted to be connected to the control circuit board 18.

Further, fuse units 16 formed by fuse blocks are incorporated midway in the circuits of the bus bar circuit unit JB.

Circuit connection which is effected by this bus bar circuit unit JB is as follows.

(1) The input terminal 10 of the power distributing unit PD and other battery-directly-connected type vehicle-mounted loads are connected to the vehicle-mounted battery (see an upper-stage portion in FIG. 1).

(2) The respective output terminals 12 of the power distributing unit PD are connected to the corresponding vehicle-mounted loads through the fuse units 16.

(3) The respective controlling terminals 17 of the power distributing unit PD, external circuits for inputting operation signals to the control circuit board 18, and external circuits to which control signals are outputted from the control circuit board 18 are connected to the control circuit board 18.

On the basis of an operation signal inputted through the bus bar circuit unit JB, a control circuit incorporated in the control circuit board 18 sends a control signal through the same bus bar circuit unit JB or directly to a vehicle-mounted electronic control unit (e.g., a door control unit, a lamp control unit, or the like), to effect its control.

Further, in addition to the aforementioned control circuit, a control circuit for controlling the on/off switching of the FETs 14 is incorporated in the control circuit board 18. On the basis of an operation signal inputted through the bus bar circuit unit JB, this control circuit similarly inputs a control signal through the bus bar circuit unit JB to the gate terminal (switching controlling terminal) of each FET so as to control the on/off switching of current between the drain and the source.

Next, referring to FIGS. 2 to 6, a description will be given of a specific structure of an electric junction box for a vehicle for realizing the circuitry shown in FIG. 1.

Figure 2:
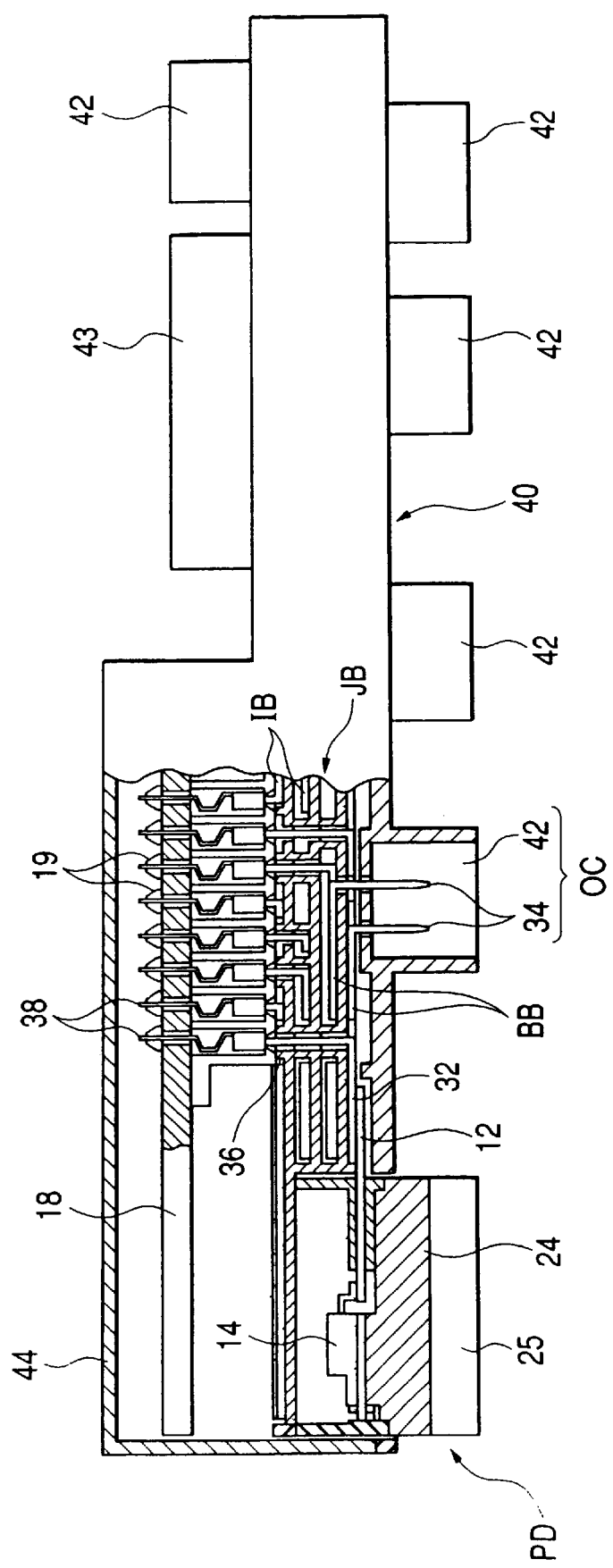
FIG. 2 is a front view, partly in section, of the electric junction box.
Figure 3:
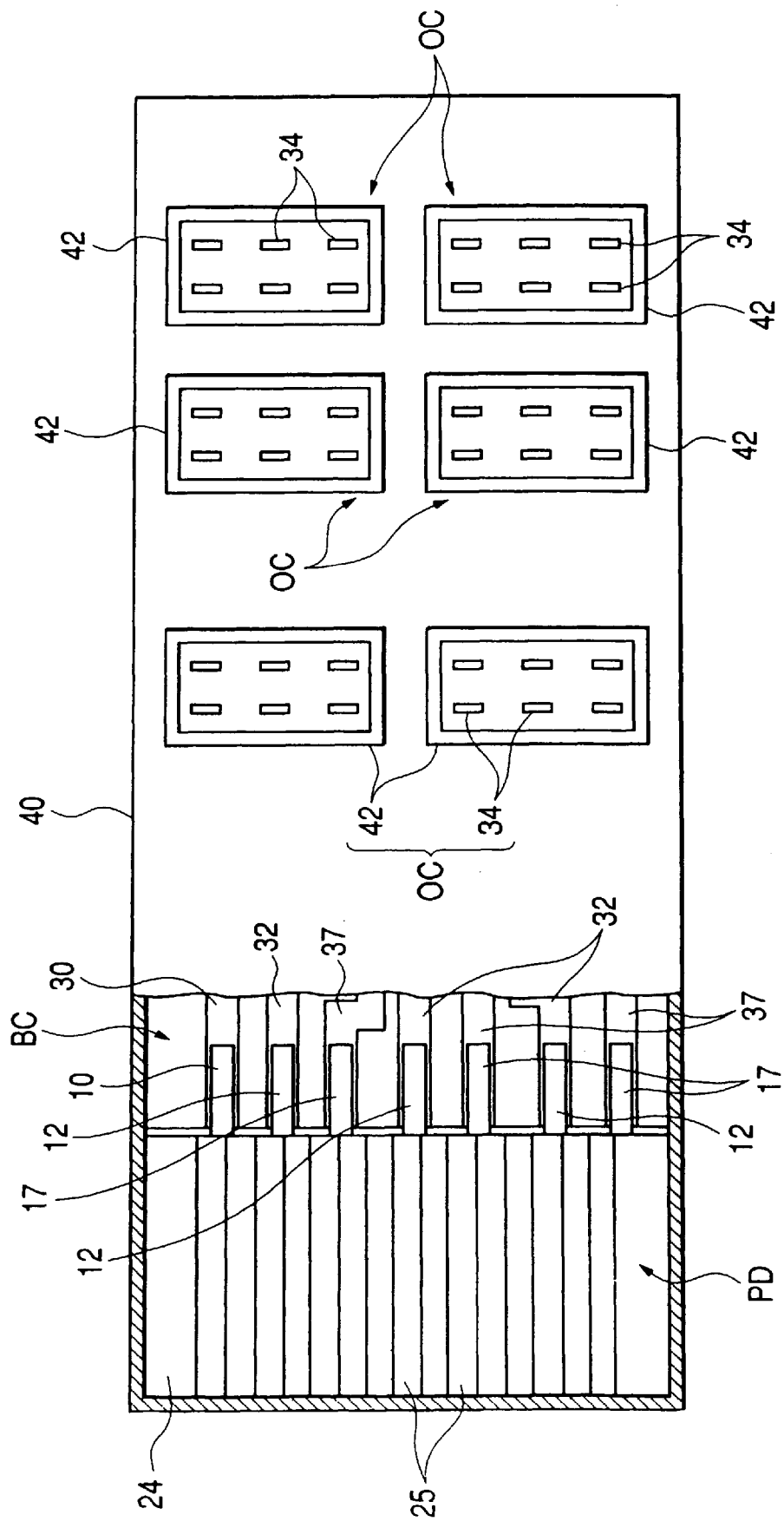
FIG. 3 is a bottom view, partly in section, of the electric junction box.

As shown in FIGS. 2 and 3, the power distributing unit PD and the bus bar circuit unit JB are juxtaposed in the horizontal direction, and are built in a common housing 40.

Figure 4:
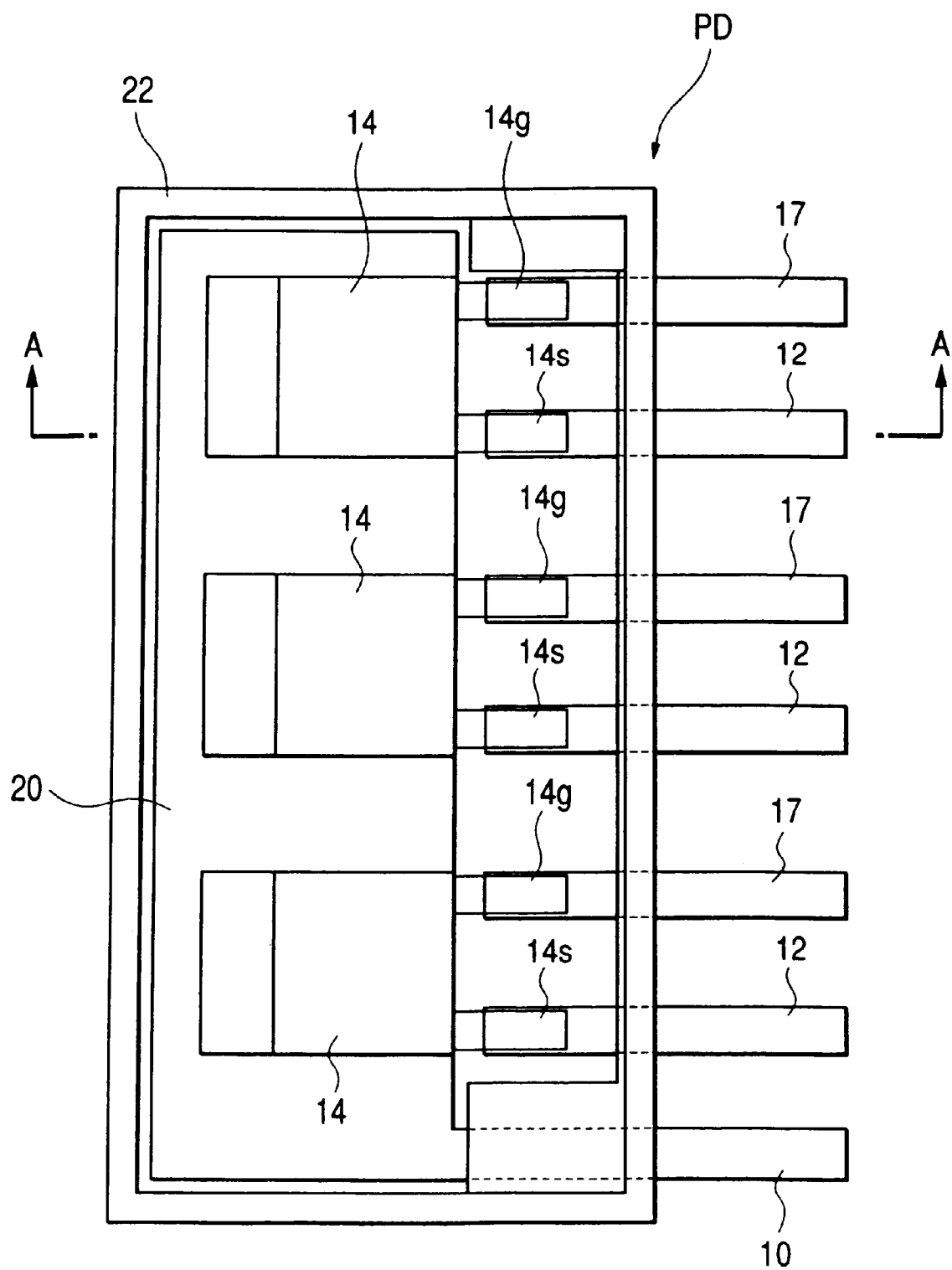
FIG. 4 is a plan view of a power distributing unit incorporated in the electric junction box.
Figure 5:
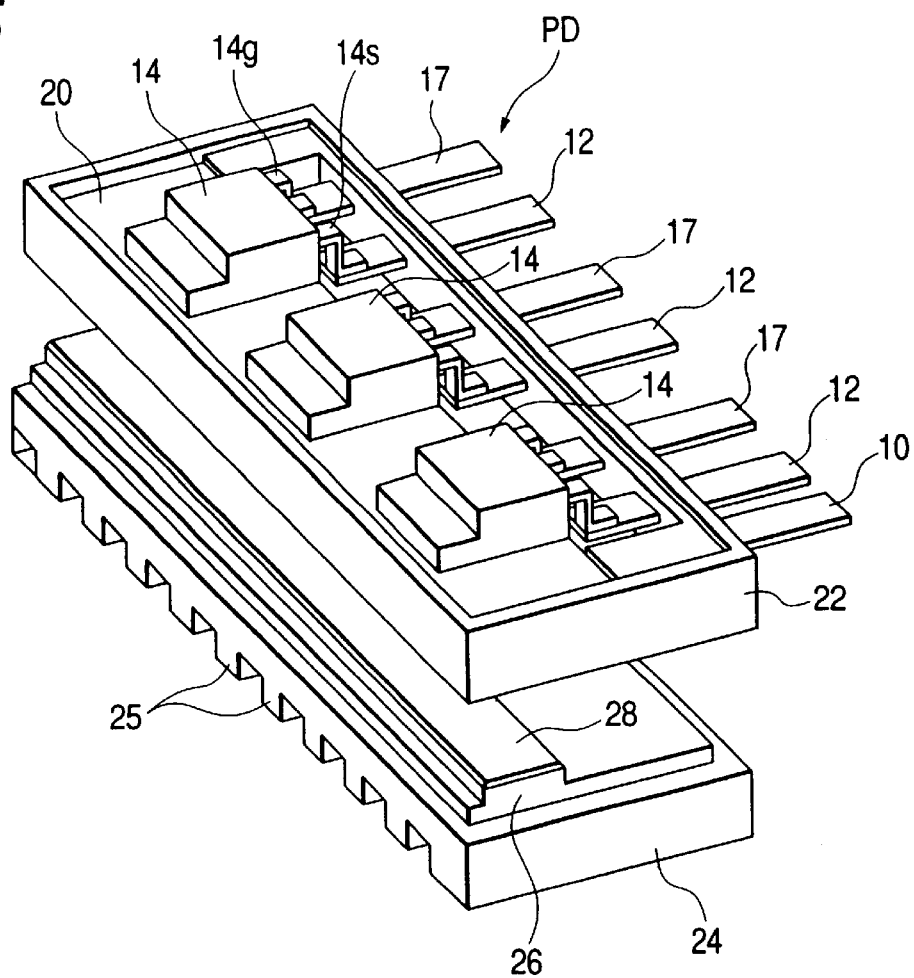
FIG. 5 is a perspective view of the power distributing unit.
Figure 6:
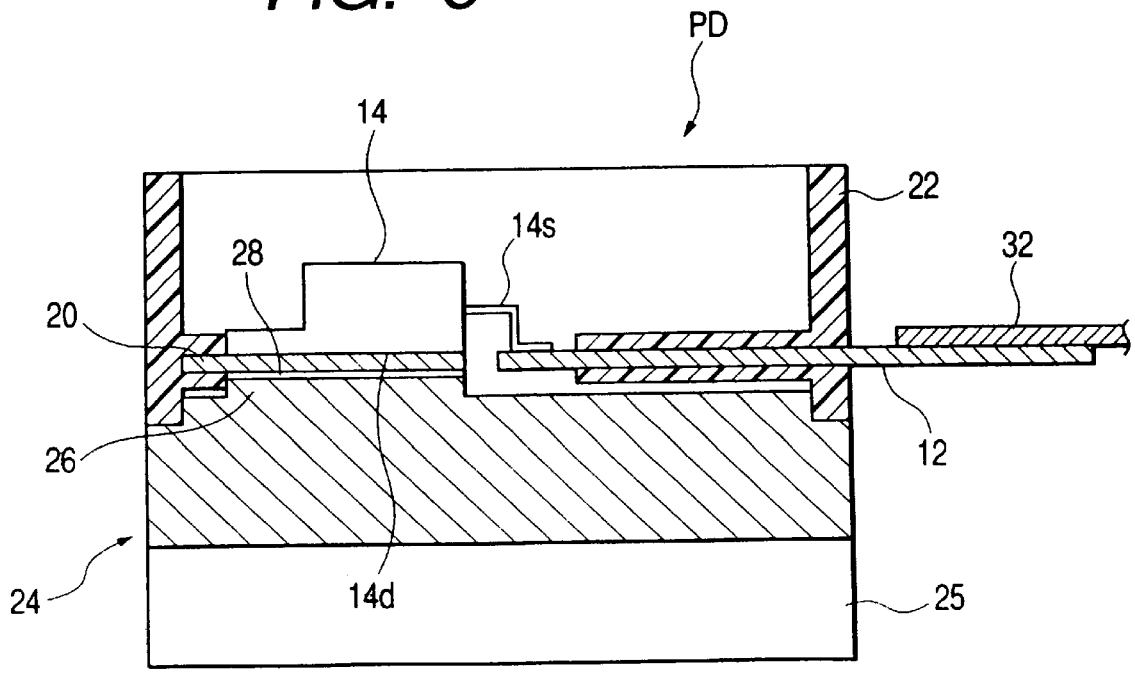
FIG. 6 is a cross-sectional view taken along line A—A in FIG. 4.

A specific structure of the power distributing unit PD is shown in FIGS. 4 to 6. In this power distributing unit PD, all conductors which make up power distribution circuit are formed of metal plates, and these metal plates are disposed in the same plane perpendicular to their thickness wise direction, and are formed integrally by resin molding.

As shown in the drawings, the input terminal 10, the plurality of (three in the illustrated example) output terminals 12, and the controlling terminals 17 are formed in the shape of strips, and are arrayed in a horizontal row in a state in which they all project in the same direction (project toward the bus bar circuit unit JB which will be described later). Specifically, the output terminal 12 and the controlling terminal 17 are alternately arrayed, and the input terminal 10 is disposed on their outer side.

On the farther side (left-hand side in FIG. 4) of these terminals 10, 12, and 17, a drain connection plate (conductor plate) 20 is disposed in such a manner as to extend in the direction of array of the terminals. This drain connection plate 20 and the input terminal 10 are formed of one and the same metal plate. Namely, the drain connection plate 20 and the input terminal 10 are integrally connected. Further, the plurality of (three in the illustrated example) of FETs 14 are arranged and mounted on this drain connection plate 20 in the direction of array of the terminals.

Of the terminals of the FETs 14, drain terminals 14*d* (see FIG. 6), which are input-side energizing terminals, are formed in such a manner as to be exposed on the reverse surface of the main body of the chip, while source terminals 14*s*, which are output-side energizing terminals, and gate terminals 14*g*, which are switching control terminals, project from a side surface of the main body of the chip in the same direction. Further, the FETs 14 are arranged in a row on the drain connection plate 20 with array and pitches corresponding to the array and pitches of the output terminals 12 and the controlling terminals 17. In a state in which the drain terminals 14*d* of the FETs 14 directly contact the drain connection plate 20, the FETs 14 are mounted on the drain connection plate 20 by means of welding or the like (e.g., soldering), and the source terminals 14*s* and the gate terminals 14*b* of the FETs 14 are respectively electrically connected to rear ends of the output terminals 12 and the controlling terminals 17 by soldering or other similar means.

It should be noted that a boosting circuit for boosting the gate voltage at each FET 14 might be included in the above-described control circuit. Further, this boosting circuit may be configured separately from the control circuit board 18, and may be interposed between the control circuit board 18 and the gate terminals 14*g* of the FETs 14 (e.g., disposed on the drain connection plate 20).

The manufacture of the power distributing unit PD is carried out by a method in which after a blank having a shape in which the terminals 10, 12, and 17 and the drain connection plate 20 are mutually connected to small-width connecting portions is punched out from a single metal plate, the punched-out metal plate is subjected to resin molding, and the connecting portions are then cut off. The resin molding forms a housing 22 of the power distributing unit PD.

As also shown in FIG. 6, this housing 22 has a shape allowing the drain connection plated 20 to be opened vertically, and the FETs 14 are disposed in its upper space. Further, the terminals 10, 12, and 17 are passed through a sidewall of the housing 22 and projects horizontally outside the housing 22.

A radiating member 24 is fitted in a lower space of the housing 22 in such a manner as to cover the same.

The overall radiating member 24 is integrally formed of a material having high thermal conductivity (or large specific heat) such as an aluminum alloy or a copper alloy, and a multiplicity of mutually parallel, and straight fins 25 are formed on the lower surface (the surface exposed outside the power distributing unit) of this radiating member 24.

On the upper surface of the radiating member 24, a base portion 26 extending in a direction parallel to the direction of array of the FETs 14 is formed in such a manner as to project upward. Further, the reverse surface of the drain connection plate 20 is connected via an insulating sheet 28 formed of silicone or the like to an upper surface of the base portion 26 in such a manner as to be capable of transferring heat.

It should be noted that, in the invention, the specific structure of the power distributing unit PD is not restricted, and the array of the terminals may be set freely. For example, the terminals 10, 12, and 17 may not necessarily be arranged in the same plane, and may be disposed in a plurality of stages arranged in the vertical direction. However, if the terminals are arranged in a substantially identical plane as described above, it is possible to make the power distributing unit PD thin, and by integrating them in a resin mold it is possible to structure a power distributing unit PD which has a simple structure and easy to handle.

The bus bar circuit unit JB is formed by a bus bar board in which each group of bus bars BB, which are circuit forming conductors made of metal plates, and each of insulating plates IB, which are respectively disposed thereon, are alternately laminated. Accordingly, lowermost-layer bus bars are exposed on the lowermost surface of the bus bar board.

At one end portion (an end portion on the side proximate to the power distributing unit PD) of the board in the lowermost surface of the board, the input-terminal connecting bus bar 30 which is a power-distribution-unit connecting bus bar, the output-terminal connecting bus bars 32, and the controlling-terminal connecting bus bars 37 are arranged with the same array as that of the input terminal 10, the output terminals 12, and the controlling terminals 17 on the power distributing unit PD side. In a state in which the input terminal 10, the output terminals 12, and the controlling terminals 17 are respectively superposed on the bus bars 30, 32, and 37 from below, the bus bars and the terminals are fixed by welding. Consequently, the power distributing unit PD and the bus bar board are arranged at adjacent positions laterally juxtaposed in a direction perpendicular to the thickness wise direction of the board, and their end portions are interconnected.

In addition, end portions of the bus bars are appropriately bent to the upper or lower side, whereby the external connection tabs 34 and the control-circuit-board connection tabs 36 are formed. Of these tabs, the control-circuit-board connection tabs 36 are connected to the control circuit board 18.

The control circuit board 18 is disposed above the power distributing unit PD and the bus bar circuit unit JB in such a manner as to straddle them in a state of being parallel to the direction of arrangement of the power distributing unit PD and the bus bar circuit unit JB. Namely, the control circuit board 18 is disposed at such a position that a portion of the control circuit board 18 overlaps the power distributing unit PD, and the remaining portion thereof overlaps that end portion of the bus bar circuit unit JB close to the power distributing unit.

Through holes 19 for circuit connection are provided at appropriate portions of the control circuit board 18. Meanwhile, the circuit-board connection tabs 36 of the bus bar circuit unit JB are disposed in a concentrated manner in a region on the side close to the power distributing unit PD (i.e., the region which overlaps the control circuit board 18), and are all bent upward. Further, relay terminals 38 are connected to these circuit-board connection tabs 36, and these relay terminals 38 are soldered in such a manner as to be passed through the through holes 19, thereby effect circuit connection between the circuits of the control circuit board 18 and the bus bar circuit unit JB.

The housing 40 of this electric junction box has a size for collectively accommodating the power distributing unit PD and the bus bar circuit unit JB, and the fins 25 of the radiating member 24 in the power distributing unit PD are exposed downward from the lower surface of this housing. Further, a board accommodating portion 44 for accommodating the control circuit board 18 is projectingly provided as an upper surface of the housing portion on the power distributing unit PD side.

In addition, connector housing portions 42 which communicate between the inner and outer sides of the housing are formed in that portion an upper surface of the housing 40 which is located alongside the board accommodating portion 44 and in the lower surface of the housing 40. As the external connection tabs 34 of the bus bar circuit unit JB project into the connector housing portions 42, connectors OC for external connection are formed. Namely, the connector terminals of the connectors OC for external connection are formed by the external connection tabs 34. The arrangement provided is such that as connectors provided in a wire harness outside the electric junction box are connected to the connectors OC for external connection, the bus bar circuit unit JB are connected to external circuits.

In addition, in addition to the connectors OC for external connection, a fuse fitting portion 43 in which a fuse box for forming the fuse units 16 is appropriately fitted is formed. The bus bars project in this fuse fitting portion 43 as well, and as the fuse box is fitted in this fuse fitting portion 43, the fuse units 16 are appropriately built in the bus bar circuit unit JB.

Next, a description will be given of the operation of the electric junction box.

The electric power which is outputted from the unillustrated vehicle-mounted battery is introduced into the bus bar circuit unit JB through the external connection tabs 34 of an appropriate connector OC for external connection, and is distributed to the drain terminals 14d of the FETs 14 through the input-terminal connecting bus bar 30 and the input terminal 10. When the FETs 14 are on, the power inputted to their drain terminals 14d is supplied to the interior of the bus bar circuit unit JB through the output terminals 12 and the output-terminal connecting bus bars 32, and the power is distributed for the vehicle-mounted loads from the bus bar circuit unit JB through its external connection tabs 34.

Meanwhile, an operation signal (e.g., a switching signal) sent from an external circuit is inputted to the control circuit of the control circuit board 18 through the bus bar circuit unit JB. In response to the operation signal, the control circuit inputs a control signal to the gate terminal 14g of each FET 14 similarly through the bus bar circuit unit JB, and controls on/off switching of current between the drain and the source in that FET 14. When the FET 14 is changed over to off, the supply of power to the bus bar circuits connected to the source terminal 14s of this FET 14 is cut off.

In the above-described electric junction box for an automobile, mechanical relay switches which are conventionally incorporated in the bus bar circuits are replaced by the FETs 14, and since these FETs 14 are disposed as the power distributing unit PD independently and in a concentrated manner, the structure of the bus bar circuit unit JB is remarkably simplified and made compact. In addition, cooling processing of the FETs 14 is facilitated. As the radiating member 24 common to these FETs is thermally connected to them and is exposed outside the housing 40, highly efficient cooling can be provided. In addition, in a case where it is necessary to replace the FETs 14 due to a change of the working current or the like, it is possible to cope with the situation by only replacing the power distributing unit PD without making a design change of the bus bar circuit unit JB, so that the electric junction box for an automobile in accordance with the invention excels in versatility.

It should be noted that the first embodiment of the invention is not limited to the above-described one, and it is possible to adopt the following forms, for example.

The semiconductor switching devices used in the power distributing unit PD are not limited to the power MOSFETs, and various semiconductor devices having switching functions, including other transistors (e.g., insulated gate bipolar transistors (IGBTs) and ordinary bipolar transistors) and various thyristors including gate turn-off thyristors (GTOs), may be used according to specifications. In addition, such semiconductor switching devices are not limited to packaged devices and, for example, may be those in which semiconductor chips are directly mounted. The form of connection between the semiconductor switching devices and the terminals are not particularly restricted and, for example, wire bonding may be used at appropriate positions.

Further, in the invention, the numbers and array of the semiconductor switching devices and output terminals may be set as required, and may be set freely in accordance with the arrangement, the number, and the like of various electrical apparatuses in the vehicle.

Although in the first embodiment the power distributing unit PD is shown in which the drain connection plate 20 and the input terminal 10 are formed of one and the same metal plate, these members may be formed separately and then connected by a means such as welding. Further, the input-side energizing terminals of the semiconductor switching devices may be individually connected to the input terminals without using the drain connection plate 20. However, by virtue of the structure of the first embodiment, the electrical connection between the semiconductor switching devices and the input terminals and the cooling of the semiconductor switching devices can be effected efficiently by using the same drain connection plate 20; therefore, it is possible to obtain an advantage in that the power distributing unit PD can be made remarkably compact.

In the invention, the output terminals may be made to project upward, for instance, and may be connected from below to the bus bars of the bus bar circuit unit JB. However, if the arrangement is provided such that, as in the first embodiment, the output terminals 12 are arrayed in one direction in the state of projecting in the same direction, the plurality of output-terminal connecting bus bars are arrayed in a peripheral edge portion of the bus bar circuit unit JB in a direction parallel to the direction of array of the output terminals, and the power distributing unit and the bus bar circuit unit are disposed at mutually adjacent positions in a state in which these bus bars and the output terminals are connected, then the power distributing unit PD and the bus bar circuit unit JB can be arranged in a substantially identical plane and in a most proximate state, thereby making it possible to render the overall electric junction box extremely compact.

In the invention, the means for connecting the terminals 10, 12, and 17 of the power distributing unit PD and the power-distributing-unit connecting bus bars 30, 32, and 37 of the bus bar circuit unit JB may be set as required. For instance, if the power distributing unit PD and the bus bar circuit unit JB are rigidly fixed inside the housing 40, and the connection may be effected by a flexible structure such as wire bonding. However, if the terminal and the bus bars are directly superposed on each other and are welded as in the first embodiment, high connection reliability can be ensured by a simple structure with a small number of component parts, and high mechanical strength of the connected portions can be maintained.

In the invention, the input terminal 10, for example, of the power distributing unit PD may be made to project in a direction different from that of the output terminals 12, and an external circuit may be directly connected to this input terminal 10. However, if the arrangement provided is such that, as described above, the input terminal 10 is made to project in the same direction as that of the output terminals 12, and the input terminals are connected to the power source through the bus bar circuit unit, all the input and output between the power distributing unit and the external circuits can be collectively effected through the common bus bar circuit unit JB. Hence, the circuitry can be rationalized, and the power distributing unit itself can be made further compact. In addition, there is another advantage in that both the connection between the power distributing unit PD and the power source and the connection between the vehicle-mounted loads and the power source without the medium of the power distributing unit PD can be collectively effected by using the common bus bar circuit unit JB.

In the invention, the control circuit for controlling the current ON/OFF of the semiconductor switching devices in the power distributing unit PD may be incorporated in the power distributing unit PD separately from the control circuit board 18. In addition, even in the case where the on/off controlling circuit for the semiconductor switching devices is incorporated in the control circuit board 18, that control circuit and the semiconductor switching devices in the power distributing unit PD may be directly connected without the medium of the bus bar circuit unit JB.

Figure 7:
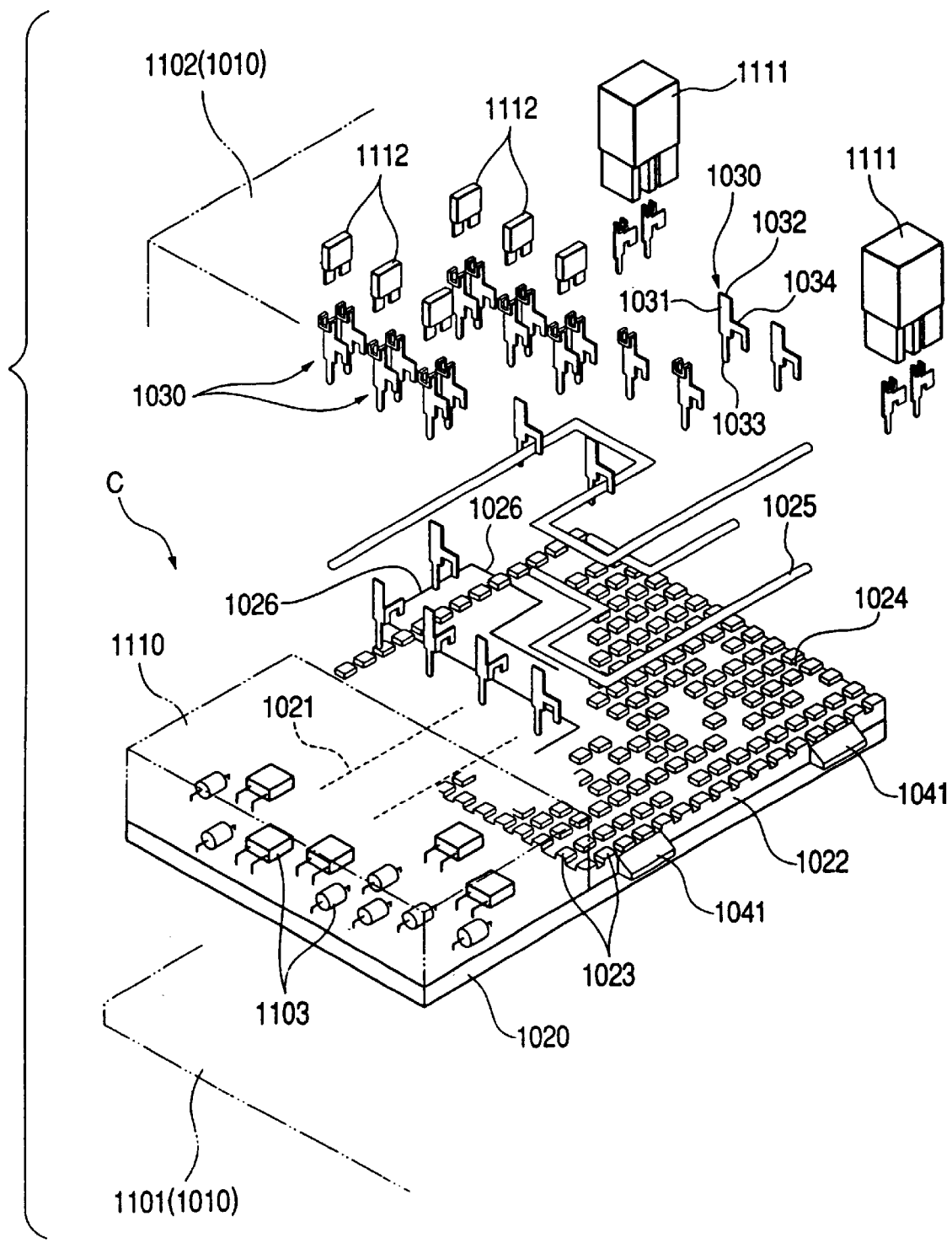
FIG. 7 is an exploded perspective view illustrating essential portions of an electric junction box in accordance with a second embodiment of the invention.

Although, in the first embodiment, the bus bar board is shown which is arranged by laminating the bus bars BB and the insulating plates IB in a plurality of layers, the bus bar circuit unit in accordance with the invention may be formed by a single layer of bus bars and an insulating plate Second Embodiment FIG. 7 is an exploded perspective view illustrating essential portions of an electric junction box in accordance with a second embodiment of the invention.

Referring to FIG. 7, an internal circuit C of the electric junction box in accordance with the second embodiment has a printed circuit board 1020. On this printed circuit board 1020, a control unit 1110 having electronic components 1103 is formed on its portion (on a left-hand portion in the drawing). A printed circuit 1021 (a small-current portion of the internal circuit C) is formed on the reverse surface (an internal layer in the case of a multi-layered type) of the printed circuit board 1020.

A wire circuit board 1022 is mounted on an upper surface of the printed circuit board 1020. The wire circuit board 1022 together with the printed circuit board 1020 constitutes an electrical wiring board. A multiplicity of rectangular projections 1023 arranged in a checkered pattern are projectingly formed on the upper surface of the wire circuit board 1002, and wire routing paths 1024 are respectively formed between these projections 1023. Covered wires 1025 for medium-current circuits and covered wires 1026 for small-current circuits, which constitute feeder circuits, are routed in these wire routing paths 1024. It should be noted that, in FIG. 7, the difference between the covered wires 1025 and 1026 is schematically indicated by the sizes of the lines, and the illustrated sizes of the wires do not show the actual sizes of the wires.

Figure 8:
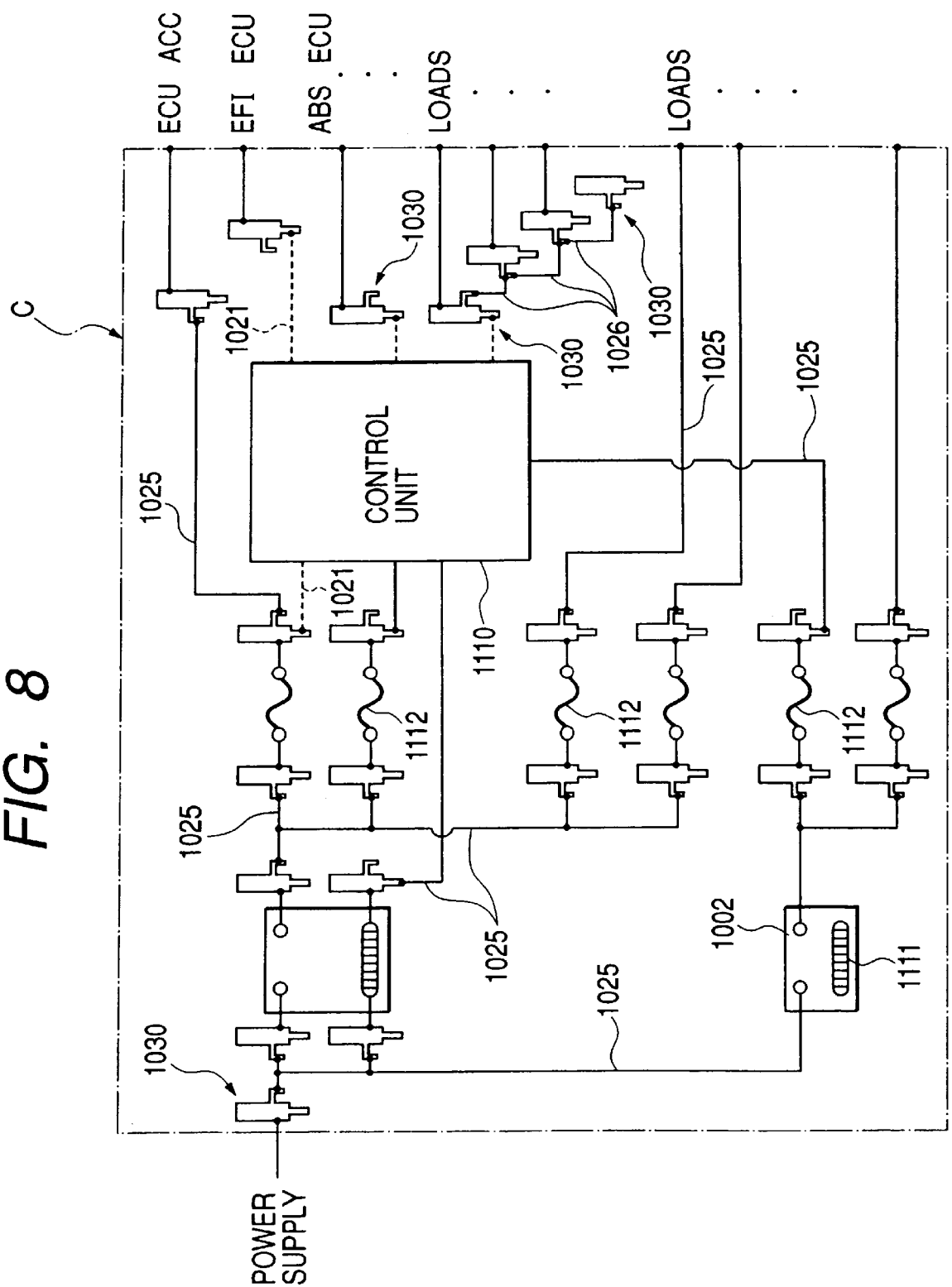
FIG. 8 is a wiring diagram in accordance with the second embodiment shown in FIG. 7.

FIG. 8 is a wiring diagram in accordance with the second embodiment shown in FIG. 7.

Referring to the drawing, the point to be noted in the illustrated example of wiring is that the covered wire 1025 or the covered wire 1026 is selectively connected to the printed circuit 1021 by a terminal 1030.

Figure 9A:
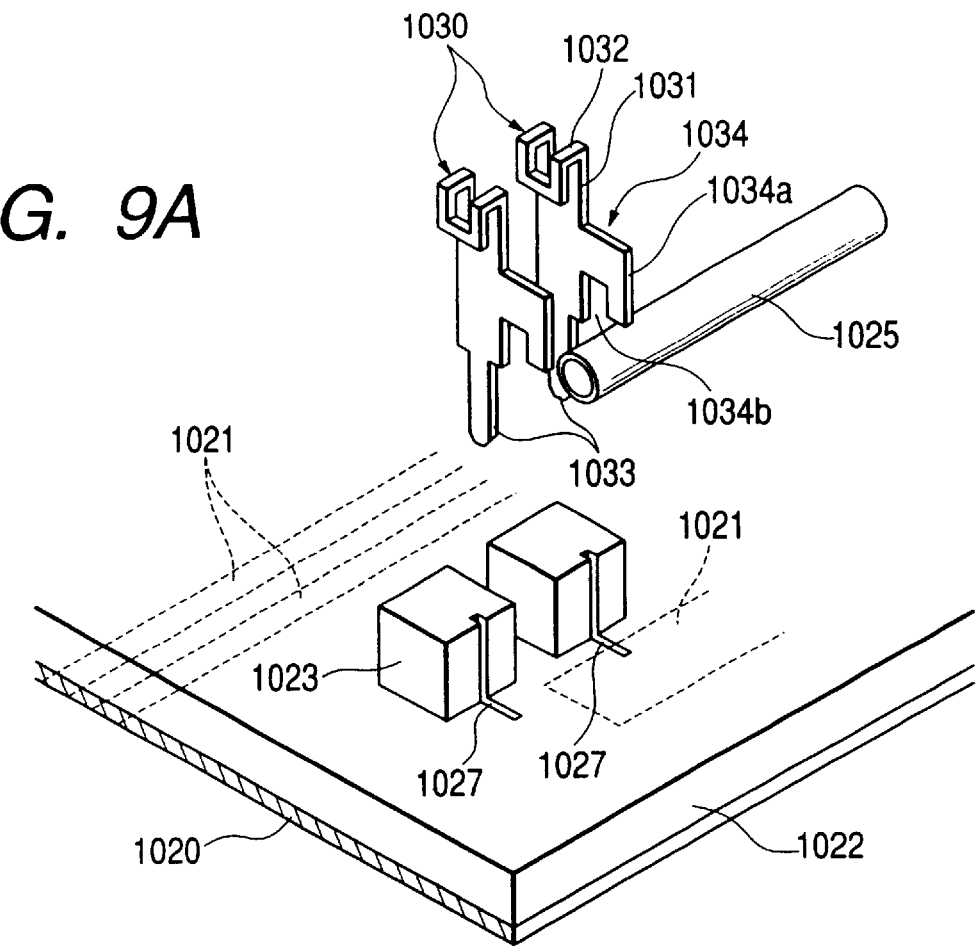
Figure 9B:
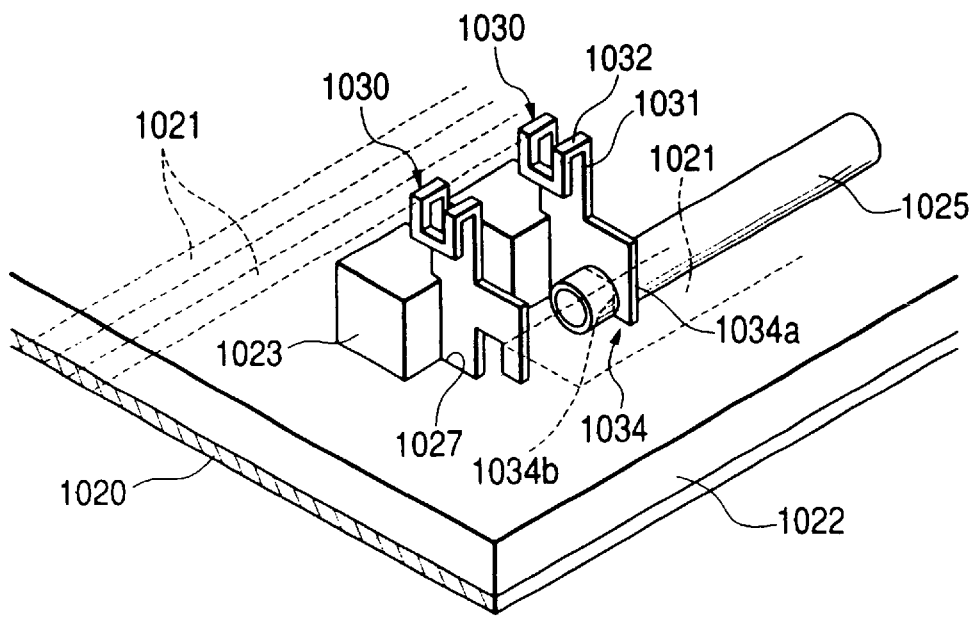

FIGS. 9A and 9B are enlarged perspective views of a terminal attaching portion shown in FIG. 8, in which FIG. 9A is an exploded view, and FIG. 9B is an assembly drawing. Further, FIGS. 4 and 5 are schematic cross-sectional views illustrating in a simplified form portions corresponding to FIGS. 9A and 9B.

Referring to these drawings, the terminals 1030 are formed by stamping a sheet metal member, and each terminal 1030 has in an integral form a plate-shaped main body portion 1031, a connecting portion 1032 formed in an upper end portion of the main body portion 1031, a lead portion 1033 formed in a lower end portion of the main body portion 1031, and a press-fitting portion 1034 formed in a side portion of the main body portion 1031.

The connecting portion 1032 forms a connecting member which is connected to an external contact (a flat-type fuse 1112 in the example shown in FIG. 7), and is formed in a bus bar tab-shaped male shape or female shape as shown in FIG. 7. It should be noted that the connecting portion 1032 may be formed in the shape of a tab, and a female relay terminal may be connected thereto.

Figure 10:
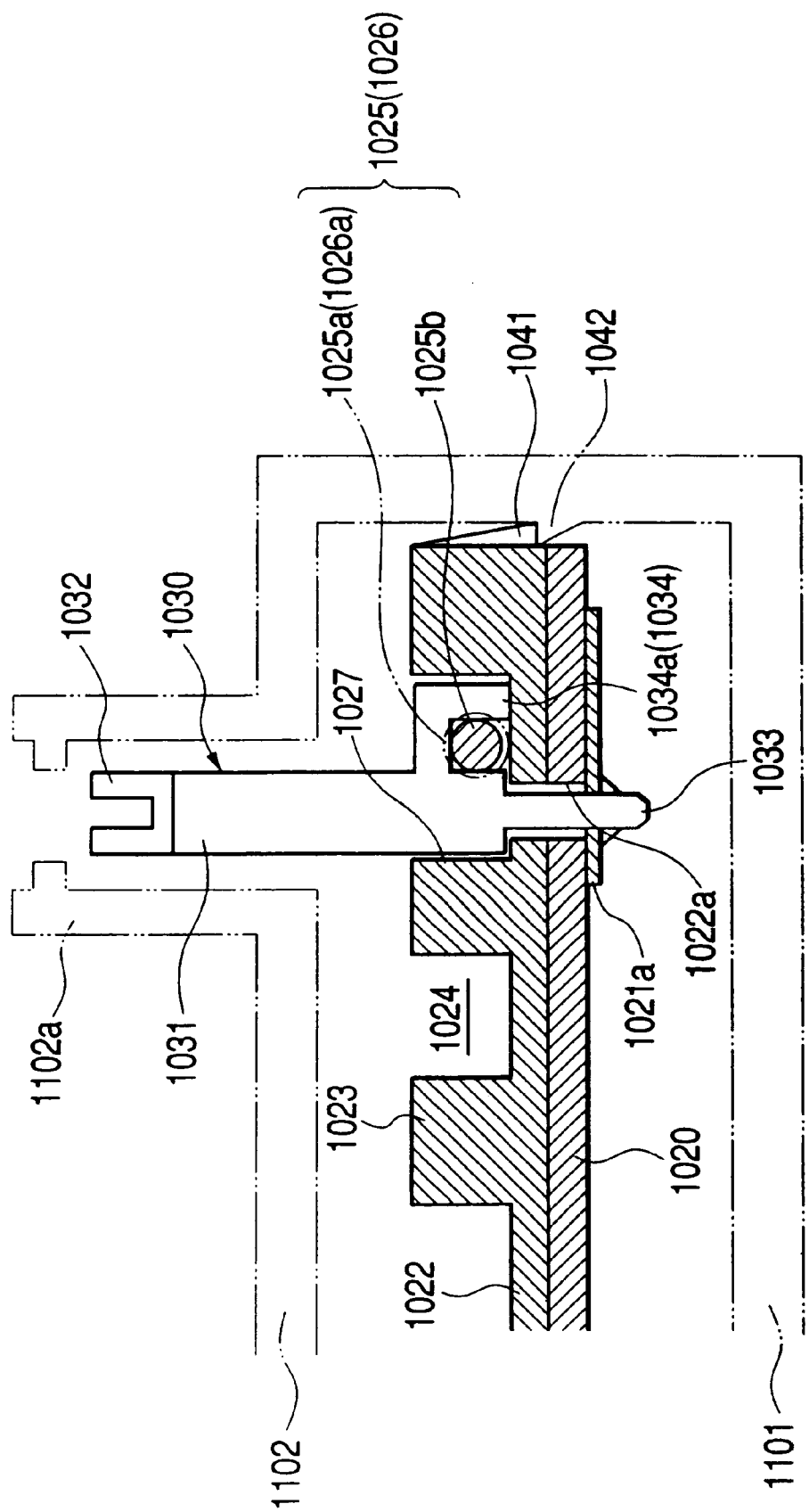
FIG. 10 is a schematic cross-sectional view illustrating in a simplified form the portions corresponding to FIGS. 9A and 9B.

Referring to FIGS. 9A, 9B and 10, the lead portion 1033 is formed in a plate shape capable of being passed through a slit 1027 formed in the wire circuit board 1022. As each lead portion 1033 is selectively connected and soldered to the printed circuit 1021 formed on the reverse surface of the printed circuit board 1020 through the slit 1027 and a through hole (not shown) in the printed circuit board 1020 continuing to the slit 1027. Namely, the terminal 1030 making up a certain circuit is connected to the corresponding printed circuit 1021, and the terminal 1030 making up another circuit is connected to the covered wire 1025 (or the covered wire 1026) only.

Figure 11:
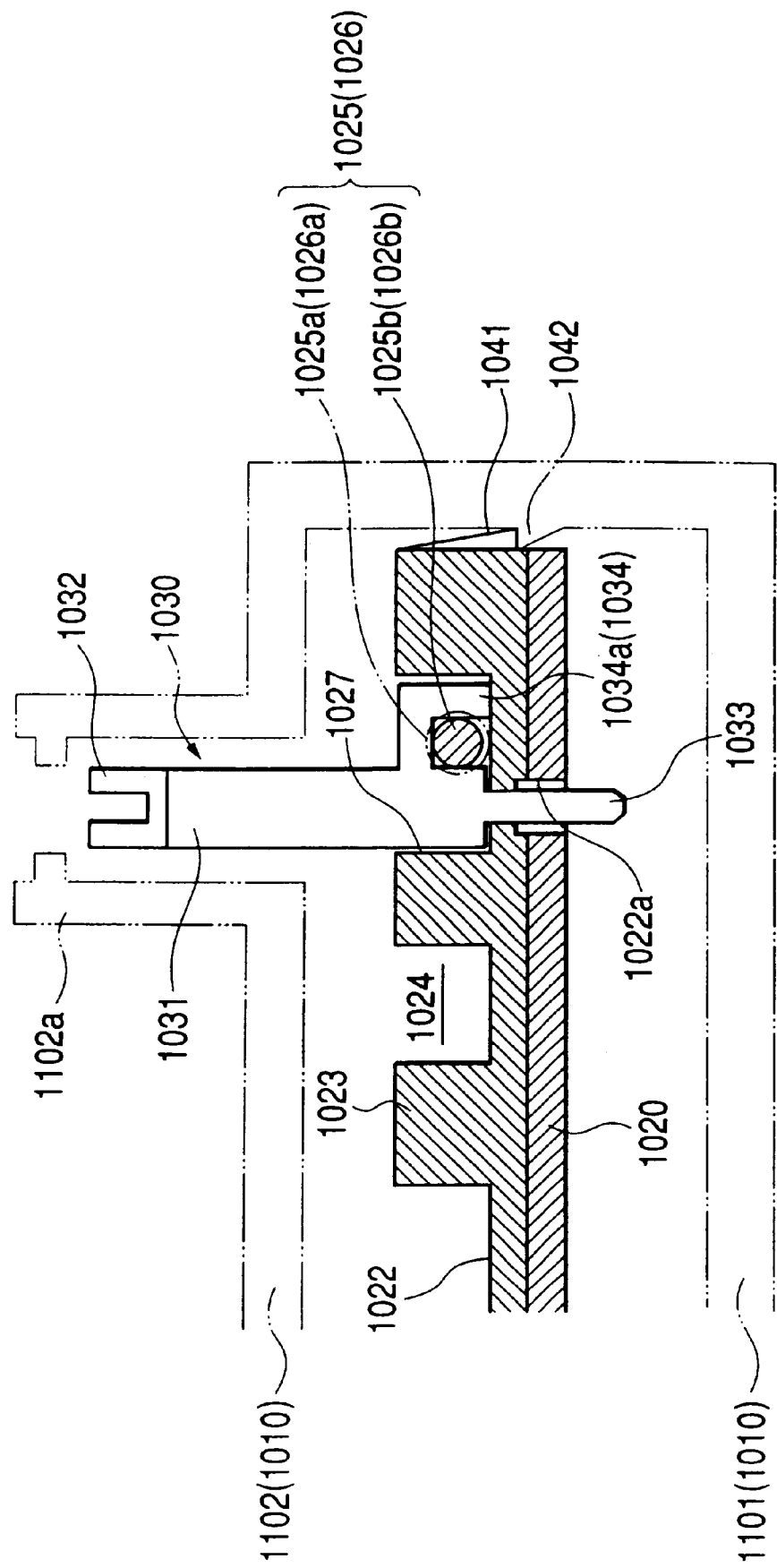
FIG. 11 is a schematic cross-sectional view illustrating in a simplified form the portions corresponding to FIGS. 9A and 9B.

Referring to FIGS. 10 and 11, the press-fitting portion 1034 is embodied by forming an arm 1034a projecting from a side portion of the main body portion 1031 in a hooked shape. The press-fitting portion 1034 as a whole is formed in a U-shape which is downwardly open as shown in the drawings, such that the covered wire 1025 is pressed into its opening 1034b to press open a relevant covering portion 1025a so as to be joined and electrically connected to an internal core 1025b.

In the second embodiment, an engaging projection 1041 is provided on a side portion of the wire circuit board 1022 to receive the load acting in the terminal 1030 when an external circuit is connected to the terminal 1030, while a retaining projection 1042 for receiving the engaging projection 1041 is provided on a housing (e.g., on an inner side wall of an upper housing 1101). Consequently, in the second embodiment, even in a case where a relatively thin type for a small current is adopted as the printed circuit board 1020, a load from the outside is prevented from being directly applied to the printed circuit board 1020. Even in a case where the wiring structure such as the one described above (namely, the structure in which the covered wire 1025 or 1026 is connected to the printed circuit 1021 by the terminal 1030) is adopted, it becomes possible to obtain satisfactory mechanical strength, thereby making it possible to form a compact and lightweight electric junction box.

When the above-described electric junction box is assembled, after the covered wires 1025 and 1026 are routed in the wire routing paths 1024 of the wire circuit board 1022, the terminals 1030 are respectively press-fitted to predetermined slits 1027. Then, the wire circuit board 1022 is mounted on the printed circuit board 1020 where the printed circuits 1021 are formed, and the lead portions 1033 projecting from the reverse surface of the printed circuit board 1020 are soldered. Through this mounting operation, predetermined ones of the press-fitting portions 1034 of the terminals 1030 are brought into pressure contact with the covered wire 1025 or 1026 corresponding thereto, thereby establishing electrical connection between the terminals 1030 and the covered wire 1025 or 1026. Next, as the lead portions 1033 of the predetermined ones of the terminals 1030 are soldered, the relevant terminals 1030 are connected to the predetermined printed circuit 1021 corresponding thereto. Consequently, wiring can be effected efficiently by using a wiring material corresponding to the current value, and the covered wire 1025 (or 1026) can be connected to the printed circuit 1021 located immediately therebelow in a state in which sufficient strength is provided mechanically.

As described above, in the second embodiment, since the terminals 1030 have the connecting portions 1032 connected to external electronic components (relays 1111, the fuses 1112), the electrically conductable lead portions 1033, and the press-fitting portions 1034, the external electronic components can be selectively connected to the printed circuits 1021 electrically connected to the lead portions 1033 and the covered wires 1025 (1026) which are electrically connected to the press-fitting portions 1034. Consequently, the covered wire 1025 (1026) can be connected to the printed circuit 1021 located immediately therebelow, thereby making it possible to obtain a more versatile wiring form.

Further, in the second embodiment, since the internal circuit C and the external circuits are connected by the terminals 1030, in a case where the numbers of fuses 1112 connected to some relays 1111 and the loads are to be increased, there is an advantage in that the measure can be easily adopted by increasing the number of terminals 1030 and causing their press-fitting portions 1034 to be brought into pressure contact with the corresponding covered wires.

In addition, by adopting the wire circuit board 1022, the terminals 1030 can be arranged in order on, for instance, the upper surface of the wire circuit board 1022, so that there is an advantage in that the alignment of the terminals 1030 can be effected easily.

Further, since a load supporting member (the engaging projection 1041 and the retaining projection 1042) whereby the connecting load from the electronic components (the relays 1111, the fuses 1112) acting on the terminals 1030 is supported by a housing 1010 is provided on the wire circuit board 1022 and the housing 1010, there is an advantage in that an excess stress is prevented from being exerted on the printed circuit board 1020 with the wire circuit board 1022 mounted thereon, making it possible to suppress solder cracks.

The second embodiment has been given merely by way of illustration of a preferred example of the invention, and the invention is not limited to the second embodiment. For example, the invention is applicable not only to the case where no bus bars are used as in the second embodiment but also to the case where some circuits are formed by bus bars insofar as no hindrance is caused to the integration and versatility of the circuits.

Figure 12:
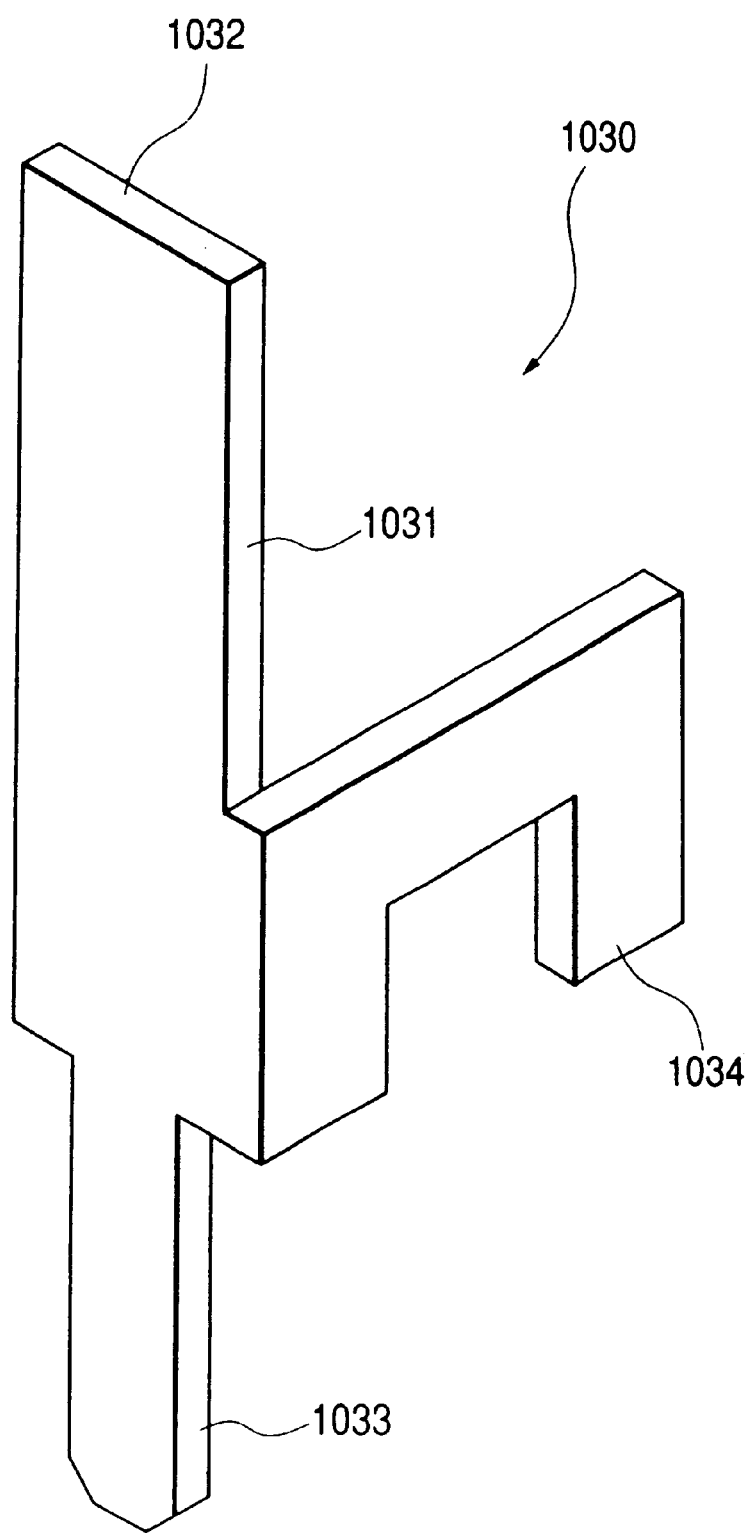
FIG. 12 is a perspective view of a terminal in accordance with a modification of the invention.
Figure 13:
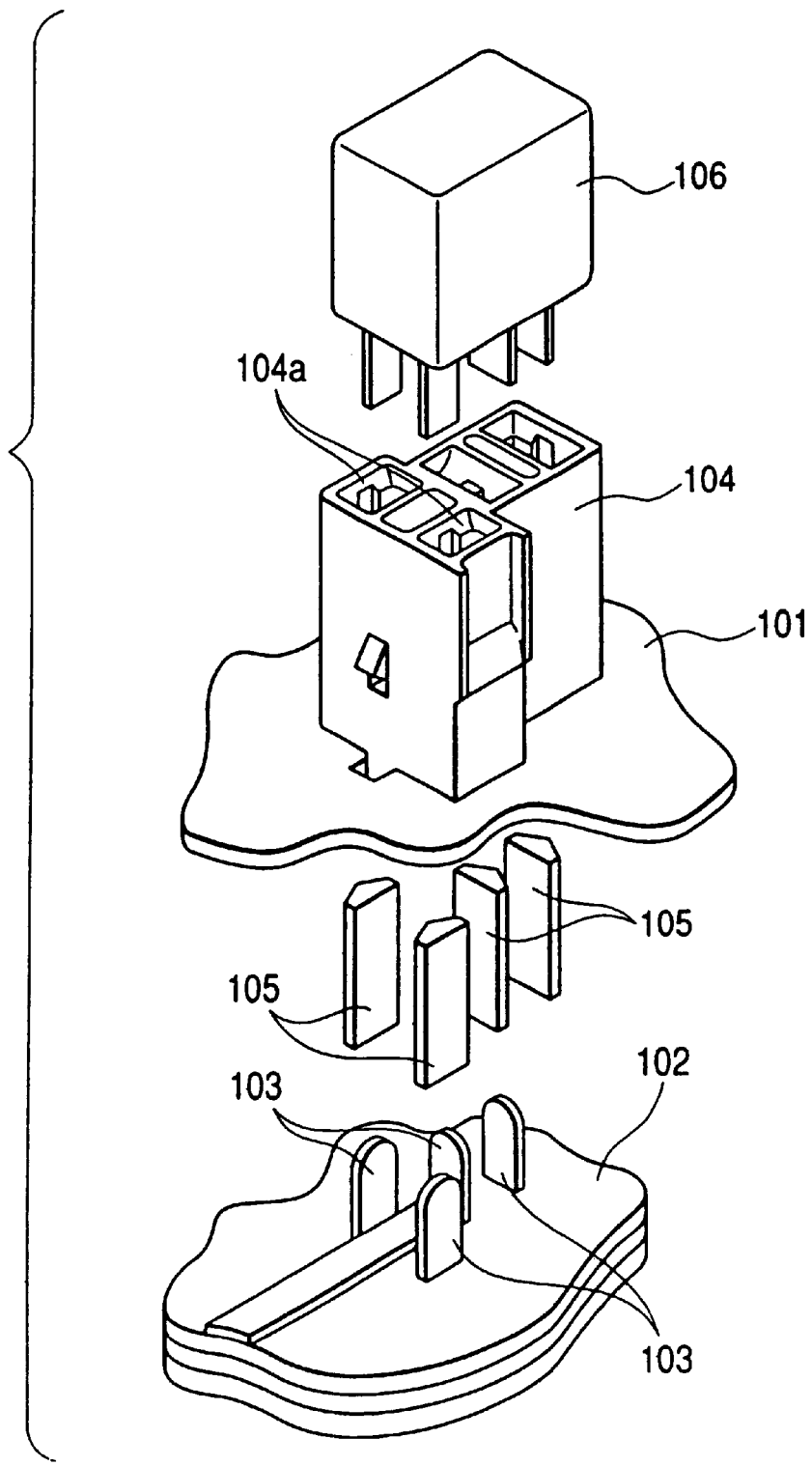
FIG. 13 is a perspective view illustrating a structure for mounting a relay block in a conventional electric junction box.

Alternatively, as shown in FIG. 12 which illustrates a modification of the terminal, it is possible to adopt a terminal having the press-fitting portion 1034 formed in orthogonal to the tab-shaped connecting portion 1032.

In addition, it goes without saying that various design changes are possible within the cope of claim of the invention.

As described above, in the invention, instead of a relay block which is present in the bus bar circuits in the conventional electric junction box, semiconductor switching devices are provided, and the power distributing unit which is independent of the bus bar circuit unit is structured by concentrating these semiconductor switching devices, output terminals of this power distributing unit being connected to appropriate bus bars of the bus bar circuit unit. Therefore, advantages are offered in that electrical connection can be established between the power source and the loads with a compact and single structure as compared with a conventional electric junction box, and that it is possible to provide a highly versatile electric junction box.

Moreover, in accordance with the invention, by using the terminals each having the connecting portion, the lead portion, and the press-fitting portion which are formed integrally, an outstanding advantage is offered in that the connection between the covered wires and the printed circuits can be effected satisfactorily in adopting necessary and sufficient wiring materials in correspondence with current values.

What is claimed is:

1. An electric junction box for a vehicle for connecting a plurality of vehicle-mounted loads to a power source mounted in a vehicle, the electric junction box comprising:
   a power distributing unit having an input terminal connected to the power source, a plurality of output terminals, and a plurality of semiconductor switching devices interposed between the input terminal and each of the output terminals;
   a bus bar circuit unit having a plurality of metallic bus bars for forming circuits and a plurality of insulating plates each laminated on the plurality of metallic bus bars, the bus bar circuit unit for connecting the output terminals of the power distributing unit to the plurality vehicle-mounted loads; and
   a housing incorporating the power distributing unit and the bus bar circuit unit under a condition that some of the bus bars in the bus bar circuit unit are connected with the output terminals of the power distributing unit.

2. The electric junction box according to claim 1, wherein the plurality of bus bars and the plurality of insulating plates are alternately superposed on each other in the bus bar circuit unit, and the output terminals of the power distributing unit are connected to the bus bar in the lowermost surface of the bus bar circuit unit.

3. The electric junction box according to claim 1, wherein each of the output terminals of the power distributing unit and some of the bus bars are being directly superposed and connected.

4. The electric junction box according to claim 3, wherein each of the output terminals of the power distributing unit and some of the bus bars are connected by welding.

5. The electric junction box according to claim 1, wherein the power distributing unit includes a radiating member connected to each of the semiconductor switching devices to transfer heat thereto; and
   the power distributing unit is incorporated in the housing to expose the radiating member from an outer surface of the housing.

6. The electric junction box according to claim 5, wherein the power distributing unit includes a drain connection plate on which the semiconductor switching devices are mounted under the condition that the drain connection plate is electrically connected to the input terminal of the power distributing unit and input-side energizing terminals of the semiconductor switching devices are electrically connected to the drain connection plate; and
   wherein the radiating member is connected to the drain connection plate to transfer heat thereto.

7. The electric junction box according to claim 6, wherein the drain connection plate and the input terminal are formed from one metal plate.

8. The electric junction box according to claim 1, further comprising a plurality of power-distributing-unit connecting bus bars arrayed in a peripheral edge portion of the bus bar circuit unit,
   wherein the output terminals of the power distributing unit are arrayed in a direction so that all of the output terminals project in the same direction;
   the power-distributing-unit connecting but bars are arrayed in a direction parallel to the direction of the array of the output terminals; and
   the power distributing unit and the bus bar circuit unit are disposed at mutually adjacent positions so that the bus bars and the output terminals are connected to each other.

9. The electric junction box according to claim 8, wherein the semiconductor switching devices are arrayed in a direction parallel to the direction of the array of the output terminals in the power distributing unit, and an output-side switching terminal of each of the semiconductor switching devices are directly connected to each of the output terminals.

10. The electric junction box according to claim 8, wherein the output terminals and the input terminal of the power distributing unit are arrayed in one direction so that the output terminals and the input terminal project in the same direction;
    the plurality of power-distributing-unit connecting bus bars are arrayed in the peripheral edge portion of the bus bar circuit unit in the direction parallel to the direction of the array of the output terminals and the input terminal; and
    the bus bars are connected to the output terminals and the input terminal so that the input terminal is connected to the power source through the bus bar circuit unit.

11. The electric junction box according to claim 1, further comprising a control circuit board connected to external vehicle-mounted electronic units through the bus bar circuit unit and disposed in the housing, the control circuit board including a switching control circuit electrically connected to switching control terminals of the semiconductor switching devices of the power distributing unit to control the switching of the semiconductor switching devices.

12. The electric junction box according to claim 11, wherein the switching control circuit of the control circuit board and the switching control terminals of the semiconductor switching devices are electrically connected through the bus bar circuit unit.

13. The electric junction box according to claim 12, comprising a plurality of power-distributing-unit connecting bus bars arrayed in a peripheral edge portion of the bus bar circuit unit,
    wherein the power distributing unit has a plurality of controlling terminals connected to the switching control terminals of the semiconductor switching devices;
    the controlling terminals and the output terminals are arrayed in one direction so that each of the controlling terminals and each of the output terminals are alternately arranged and project in the same direction;
    the plurality of power-distributing-unit connecting bus bars are arrayed in a direction parallel to the direction of the array of the output terminals and the controlling terminals; and
    the power distributing unit and the bus bar circuit unit are disposed at mutually adjacent positions so that the bus bars are connected to the output terminals and the controlling terminals.

14. The electric junction box according to claim 11, wherein the control circuit board is disposed to be substantially parallel to a direction of the array of the power distributing unit and the bus bar circuit unit.

15. The electric junction box according to claim 14, wherein the control circuit board is disposed such that at least a portion of the control circuit board overlaps the power distributing unit; and the control circuit board comprises a board accommodating portion for accommodating the control circuit board and a connector portion for connecting the bus bar circuit unit to external circuits, the connector portion disposed adjacent to the board accommodating portion.

16. The electric junction box according to claim 11, wherein the semiconductor switching devices are arrayed in a direction parallel to the direction of the array of the output terminals and the controlling terminals, and output-side switching terminals; and the switching control terminals of the semiconductor switching devices are respectively directly connected to the output terminals and the controlling terminals.

17. The electric junction box according to claim 11, wherein the output terminals, the input terminals, and the controlling terminals of the power distributing unit are arrayed in one direction to project in the same direction;

the plurality of power-distributing-unit connecting bus bars are arrayed in the peripheral edge portion of the bus bar circuit unit in the direction parallel to the direction of the array of the output terminals, the input terminal and the controlling terminals; and the bus bars are connected to the output terminals, the input terminal, and the controlling terminals so that the input terminal is connected to the power source through the bus bar circuit unit.

18. The electric junction box according to claim 1, wherein each of the terminals of the power distributing unit is formed from a metal plate, and is disposed in a substantially identical plane.

19. The electric junction box according to claim 18, wherein the terminals are integrally formed by resin molding to be disposed in the substantially identical plane, a power-distributing-unit housing is formed by the resin molding, and the terminals project from the housing toward the bus bar circuit unit side.

* * * * *